United States Patent
Bleeker (10) Patent No.: US 7,053,981 B2
(45) Date of Patent: May 30, 2006

(54) LITHOGRAPHIC APPARATUS AND DEVICE MANUFACTURING METHOD

(75) Inventor: Arno J. Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 93 days.

(21) Appl. No.: 10/812,994

(22) Filed: Mar. 31, 2004

(65) Prior Publication Data

US 2005/0219497 A1    Oct. 6, 2005

(51) Int. Cl.
*G03B 27/42* (2006.01)
*G02B 26/00* (2006.01)
*G02B 26/08* (2006.01)

(52) U.S. Cl. .................... 355/53; 359/223; 359/292

(58) Field of Classification Search ............... 355/53, 355/67, 71; 359/223, 224, 322, 323, 292
See application file for complete search history.

(56) References Cited

U.S. PATENT DOCUMENTS

| | | |
|---|---|---|
| 5,221,989 A | 6/1993 | Stappaerts et al. |
| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,768,003 A * | 6/1998 | Gobeli ............... 359/254 |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,489,984 B1 | 12/2002 | Johnson |
| 6,687,041 B1 | 2/2004 | Sandstrom |
| 6,747,783 B1 | 6/2004 | Sandstrom |
| 6,795,169 B1 | 9/2004 | Tanaka et al. |
| 6,806,897 B1 | 10/2004 | Kataoka et al. |
| 6,811,953 B1 | 11/2004 | Hatada et al. |
| 6,934,439 B1 * | 8/2005 | Mala et al. ............... 385/18 |
| 2002/0097495 A1 * | 7/2002 | Mei ..................... 359/618 |
| 2003/0223679 A1 | 12/2003 | Mala |

(Continued)

FOREIGN PATENT DOCUMENTS

EP    1 482 375 A2    12/2004

(Continued)

OTHER PUBLICATIONS

European Search Report for European Application No. 05251791.9 mailed on Aug. 5, 2005, pp. 1-4.

*Primary Examiner*—Alan Mathews
(74) *Attorney, Agent, or Firm*—Sterne, Kessler, Goldstein & Fox P.L.L.C.

(57) ABSTRACT

A lithographic apparatus and method are used to pattern a substrate. The system and method includes an illumination system for supplying a projection beam of radiation, an array of individually controllable elements for imparting the projection beam with a pattern in its cross-section, and a substrate table for supporting the substrate during an exposure operation. A projection system projects the patterned beam onto a target portion of the substrate. A control system sends a control signal for setting each said individually controllable elements to a desired state. A compensation device for adjusting the control signal applied to a first individually controllable element based on the control signal to be applied to at least one other individually controllable element. This can be done to reduce image degradation arising from cross-talk between individually controllable elements.

18 Claims, 7 Drawing Sheets

U.S. PATENT DOCUMENTS

| | | |
|---|---|---|
| 2004/0041104 A1 | 3/2004 | Liebregts et al. |
| 2004/0053143 A1 | 3/2004 | Sandstrom |
| 2004/0130561 A1 | 7/2004 | Jain |
| 2005/0041916 A1* | 2/2005 | Miller et al. .................. 385/18 |

FOREIGN PATENT DOCUMENTS

| | | |
|---|---|---|
| WO | WO 98/33096 | 7/1998 |
| WO | WO 98/38597 | 9/1998 |

* cited by examiner

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., part of one or several dies) on a substrate (e.g., a silicon wafer or glass plate) that has a layer of radiation-sensitive material (e.g., resist). Instead of a mask, the patterning means may comprise an array of individually controllable elements which serve to generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (e.g., the "scanning"-direction) while synchronously scanning the substrate parallel or anti-parallel to this direction.

In order to obtain improved resolution, it has been desirable to produce increasingly closely packed arrangements of the array of individually controllable elements. As the elements become smaller and less spatially separated, it has been found that image quality is degraded.

Therefore, there is a need for an improved lithographic apparatus wherein image degradation is substantially reduced or eliminated.

SUMMARY OF THE INVENTION

An embodiment of the present invention provides a lithographic apparatus including an illumination system for supplying a projection beam of radiation, an array of individually controllable elements serving to impart the projection beam with a pattern in its cross-section, a substrate table for supporting a substrate during exposure with the patterned projection beam, a projection system for projecting the patterned beam onto a target portion of the substrate, a control system for sending a control signal for setting each of said individually controllable element to a given state and a compensation device for adjusting the control signal applied to a first individually controllable element based on the control signal to be applied to at least one other individually controlled element.

Image degradation can arise from interference (i.e., "cross-talk") occurring between individual elements of the array of individually controllable elements. The compensation device described above can provide an efficient and flexible device for reducing image degradation arising in this way. The apparatus provides a cost effective alternative to attempting to design an array of individually controllable elements that do not interact with each other. In particular, much smaller elements and/or elements that are more closely spaced, or which are mechanically linked, may be used without excessive detriment to the image written to the substrate.

In one embodiment, the compensation device can be arranged to adjust the control signal applied to a first individually controllable element based on the control signal applied to one or more individually controllable elements comprising nearest neighbors. Under many circumstances, the group of nearest neighbors represents the group of elements that most influence the first individually controllable element. By taking account of only these elements, it is possible to reduce the amount of computation and/or hardware that is required to implement the compensation device. This arrangement can also have an effect on how quickly compensation can be applied and therefore influence the rate at which the lithographic apparatus may operate.

In another embodiment, the compensation device can be arranged to adjust the control signal applied to a first individually controllable element based on the signal applied to a group of individually controllable elements comprising next-nearest neighbors. Next-nearest neighbors are the next most important (after the nearest neighbors) to the operation of the first individually controllable element (either in terms of close spatial separation or the strength of cross-talk that they produce). Next-nearest neighbor influences are likely to be smaller than nearest neighbor influences, but it may nevertheless be necessary to take them into account in order to achieve a higher level of compensation.

Depending on the degree of compensation required and the spatial extent of cross-talk, it may be necessary to consider additionally elements even further separated from the first individually controllable element than the next-nearest neighbors.

In a further embodiment, the compensation device may be arranged to adjust the control signal applied to a first individually controllable element based on the control signal applied to a group of individually controllable elements including elements that are mechanically linked to the first individually controllable element. Depending on the configuration of the array of individually controllable elements, it may be that those elements that are most relevant when considering cross-talk with a first individually controllable element are not the nearest neighbors. Similarly, the group of next nearest neighbors may not be the appropriate choice of elements for the next level of compensation. The group of elements that are most important for the purposes of compensation will, in general, depend on the type of physical interaction that is causing the cross-talk. For example, in the case where the physical interaction in question is a mechanical interaction, the elements that it will be most important to compensate for will be those that are most strongly linked to the first individually controllable element. In the case where elements share a common hinge, for example, the most important elements may be those that are adjacent to the first individually controllable element along the axis of the hinge. A higher level of compensation may be achieved by taking into account further elements located along the axis of the hinge.

In a still further embodiment, the compensation device may include a memory module. The memory can be capable of storing compensation data representing the expected effect on the first controllable element caused by a signal applied to at least one other individually controllable element. The compensation data stored by the memory module may be accessed efficiently, and may represent the expected effect on the first controllable element caused by a signal applied to a large number of other individually controllable elements. Each of the other individually controllable elements may have received a different control signal and be in a different state and, similarly, the first controllable element may also have been set to one of a number of possible states by its own control signal. The large number of configurations possible means that the compensation data volume may need to be quite large in order to achieve a good level of compensation. The use of a dedicated memory module provides more scope for storing such data in an easily accessible form.

In a still further embodiment, the compensation device may be coupled to the control system to provide a compensated control signal to be sent to the first individually controllable element that is adjusted by an amount based on the control signal applied to at least one other individually controllable element and the compensation data provided by the memory module. Adjusting the control signal before it is sent to the array of individually controllable elements can be advantageous because the compensation procedure, which may be quite sophisticated, may be incorporated into the software and/or hardware of the control system. In contrast to the situation where the control signal is adjusted at a later stage, this arrangement has the advantage of being flexible in the sense that it does not depend on particular characteristics of a single array of individually controllable elements. Also, the apparatus may be configured to operate for a variety of different arrays of individually controllable elements. The apparatus may also be tuned or adjusted in response to a performance evaluation to operate in a more effective manner for a given array of individually controllable elements. For example, the compensation may be adjusted while the apparatus is in service, allowing effective response to any changes in the properties of the individually controllable elements that may occur.

In a still further embodiment, the compensation device may include a compensating member associated with the first individually controllable element, The compensating member can be arranged to receive the control signal from the control system, adjust the level of the received signal as a predetermined function of the control signal applied to at least one other individually controllable element, and/or transmit the adjusted control signal to the first individually controllable element. This arrangement can have the advantage of simplicity with the cross-talk compensation effectively being hardwired into the array of individually controllable elements themselves. This arrangement can be beneficial in that no changes need to be made to the control system, which may simply provide a control signal to the array of individually controllable elements as though no cross-talk existed.

In an embodiment, the compensation data may take account of one or more of the following forces: electrostatic, magnetostatic, and mechanical. The actuation of each element of the array of individually controllable elements may be achieved by electrical forces such as electrostatic attraction. The magnitude of such forces decreases rapidly with distance and may also be shielded. However, where the individually controllable elements are closely spaced, it is often impractical to completely prevent electrical actuating forces associated with one element from influencing other elements nearby. Similar considerations apply for magnetostatic forces. Where a very fine array of individually controllable elements is constructed, cross-talk associated with mechanical forces may become a problem. In this case, it may be the movement itself rather than actuating forces which is felt by other elements nearby.

In another embodiment, at least a portion of the compensation data may be obtained from measurements of the effect on a first individually controllable element caused by a control signal applied to at least one other individually controllable element. The compensation data may be obtained from a series of calibration measurements, which together may be used to predict the effect of most important configurations of the array of individually controllable elements. Due to the symmetry of the array of individually controllable elements, such measurements need only be carried out over a limited area of the array. For example, the first individually controllable element may be set to a plurality of different states by a plurality of corresponding control signals and the displacements of the surrounding elements recorded. This operation may be carried out for the surrounding elements being nominally flat, and/or with the surrounding elements being set to different states.

In a still further embodiment, at least a portion of the compensation data can be obtained from calculation of the expected effect on a first individually controllable element caused by a control signal applied to at least one other individually controllable element. The calculation can be based on the geometry of the array of individually controllable elements. This procedure can be used on its own or in combination with the calibration procedure based on measurement discussed above. An advantage of calculating the expected disturbances can be that it substantially reduces or removes the need for calibration measurements and may also reduce the amount of compensation data that needs to be stored by the memory module. Saving in the amount of compensation data required may be particularly significant if the calculations are carried out wholly, or partially, "on-the-fly" (i.e., in real time). Whether or not the calculations can be carried out in real time will depend on the complexity of the geometry concerned, and also the distance over which the cross-talk operates.

Another embodiment of the present invention provides a calibration method for an array of individually controllable elements in a lithographic apparatus including the steps of applying a known control signal to a first individually controllable element and recording a resulting disturbance of at least one other individually controllable element. The calibration method can be applied repeatedly for known control signals of different magnitudes and also for different starting positions of the individually controllable elements affected by the first individually controllable element.

A further embodiment of the present invention provides a device manufacturing method including the steps of providing a projection beam radiation using an illumination system, using an array of individually controllable elements to impart the projection being with a pattern in its cross-section, projecting the patterned beam of radiation onto a target portion of a substrate, applying a control signal to each of a plurality of said individually controllable elements for setting them to a given state, and adjusting the control signal applied to a first individually controllable element based on the control signal to be applied to at least one other individually controllable element.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the present invention and to enable a person skilled in the pertinent art to make and use the present invention.

The present invention will now be described with reference to the accompanying drawings. In the drawings, like reference numbers may indicate identical or functionally similar elements.

DETAILED DESCRIPTION OF THE INVENTION

Overview and Terminology

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described hereabove, the array of individually controllable elements can comprise one or more programmable mirror arrays.

More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
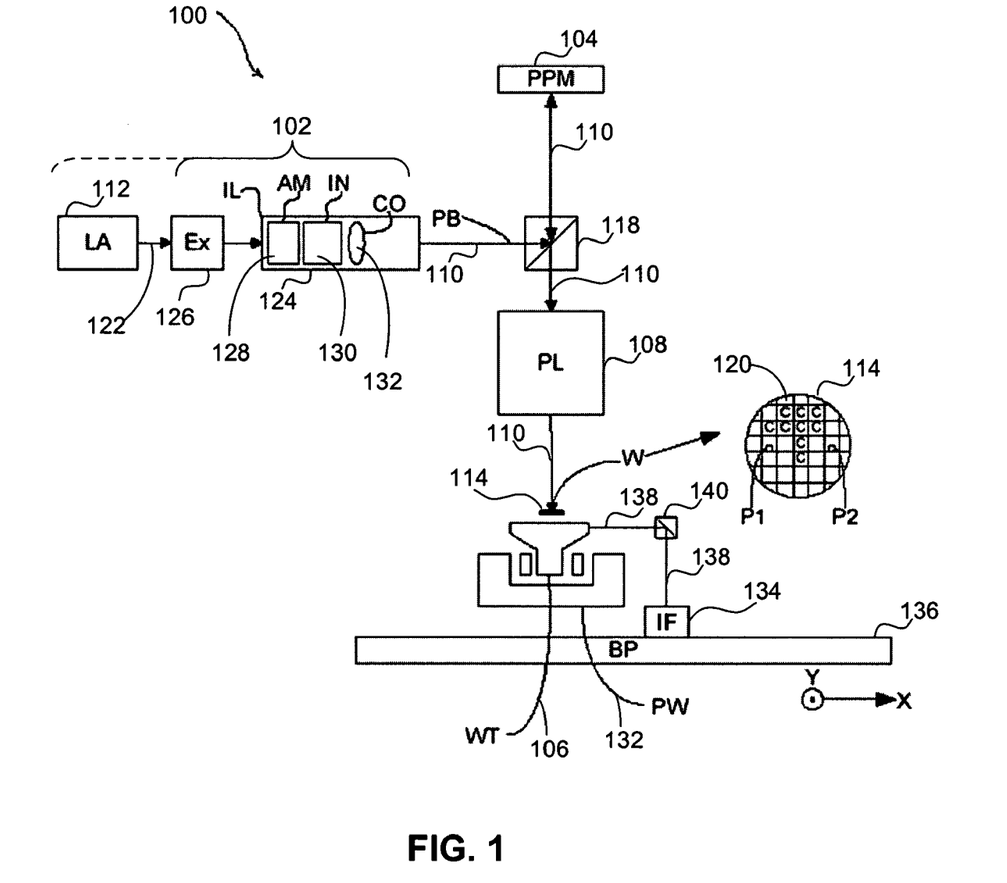
FIG. 1 depicts a lithographic apparatus according to an embodiment of the present invention.

FIG. 1 schematically depicts a lithographic projection apparatus 100 according to an embodiment of the invention. Apparatus 100 includes at least a radiation system 102 (e.g., EX, IL (e.g., AM, IN, CO, etc.) etc.), an array of individually controllable elements PPM 104, an object table WT 106 (e.g., a substrate table), and a projection system ("lens") PL 108.

Radiation system 102 can be used for supplying a projection beam PB 110 of radiation (e.g., UV radiation), which in this particular case also comprises a radiation source LA 112.

Array of individually controllable elements 104 (e.g., a programmable mirror array) can be used for applying a pattern to the projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate W 114 (e.g., a resist-coated silicon wafer or glass substrate) and object table 106 can be connected to positioning device PW 116 for accurately positioning substrate 114 with respect to projection system 108.

Projection system (e.g., a lens) 108 (e.g., a quartz and/or CaF2 lens system or a catadioptric system comprising lens elements made from such materials, or a mirror system) can be used for projecting the patterned beam received from beam splitter 118 onto a target portion C 120 (e.g., one or more dies) of the substrate 114. The projection system 108 may project an image of the array of individually controllable elements 104 onto the substrate 114. Alternatively, the projection system 108 may project images of secondary sources for which the elements of the array of individually controllable elements 104 act as shutters. The projection system 108 may also comprise a micro lens array (MLA) to form the secondary sources and to project micro spots onto the substrate 114.

The source 112 (e.g., an excimer laser) can produce a beam of radiation 122. This beam 122 is fed into an illumination system (illuminator) IL 124, either directly or after having traversed conditioning device 126, such as a beam expander Ex, for example. The illuminator 124 may comprise adjusting device AM 128 for setting the outer and/or inner radial extent (commonly referred to as σ-outer and σ-inner, respectively) of the intensity distribution in the beam 122. In addition, it will generally comprise various other components, such as an integrator IN 130 and a condenser CO 132. In this way, the beam 110 impinging on the array of individually controllable elements 104 has a desired uniformity and intensity distribution in its cross section.

It should be noted, with regard to FIG. 1, that the source 112 may be within the housing of the lithographic projection apparatus 100 (as is often the case when the source 112 is a mercury lamp, for example). In alternative embodiments, source 112 may also be remote from the lithographic projection apparatus 100. In this case, radiation beam 122 would be led into the apparatus 100 (e.g., with the aid of suitable directing mirrors). This latter scenario is often the case when the source 112 is an excimer laser. It is to be appreciated that both of these scenarios are contemplated within the scope of the present invention.

The beam 110 subsequently intercepts the array of individually controllable elements 104 after being directing using beam splitter 118. Having been reflected by the array of individually controllable elements 104 the beam 110 passes through the projection system 108, which focuses the beam 110 onto a target portion 120 of the substrate 114.

With the aid of the positioning device 116 (and optionally interferometric measuring device IF 134 on base plate BP 136 that receives interferometric beams 138 via beam splitter 140), the substrate table 106 can be moved accurately, so as to position different target portions 120 in the path of the beam 110. Where used, the positioning device for the array of individually controllable elements 104 can be used to accurately correct the position of the array of individually controllable elements 104 with respect to the path of the beam 110, e.g., during a scan. In general, movement of the object table 106 is realized with the aid of a long-stroke module (course positioning) and a short-stroke module (fine positioning), which are not explicitly depicted in Figure 1. A similar system may also be used to position the array of individually controllable elements 104. It will be appreciated that the projection beam 110 may alternatively/additionally be moveable while the object table 106 and/or the array of individually controllable elements 104 may have a fixed position to provide the required relative movement.

In an alternative configuration of the embodiment, the substrate table 106 may be fixed, with the substrate 114 being moveable over the substrate table 106. Where this is done, the substrate table 106 is provided with a multitude of openings on a flat uppermost surface, gas being fed through the openings to provide a gas cushion which is capable of supporting the substrate 114. This is conventionally referred to as an air bearing arrangement. The substrate 114 is moved over the substrate table 106 using one or more actuators (not shown), which are capable of accurately positioning the substrate 114 with respect to the path of the beam 110. Alternatively, the substrate 114 may be moved over the substrate table 106 by selectively starting and stopping the passage of gas through the openings.

Although the lithography apparatus 100 according to the invention is herein described as being for exposing a resist on a substrate, it will be appreciated that the invention is not limited to this use and the apparatus 100 may be used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. The substrate table 106 is then moved in the x and/or y directions to a different position for a different target portion 120 to be irradiated by the beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that the projection beam 110 is caused to scan over the array of individually controllable elements 104. Concurrently, the substrate table 106 is simultaneously moved in the same or opposite direction at a speed V=Mv, in which M is the magnification of the projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of the substrate 114 using a pulsed radiation system 102. The substrate table 106 is moved with an essentially constant speed such that the projection beam 110 is caused to scan a line across the substrate 106. The pattern on the array of individually controllable elements 104 is updated as required between pulses of the radiation system 102 and the pulses are timed such that successive target portions 120 are exposed at the required locations on the substrate 114. Consequently, the projection beam 110 can scan across the substrate 114 to expose the complete pattern for a strip of the substrate 114. The process is repeated until the complete substrate 114 has been exposed line by line.

4. Continuous scan mode: essentially the same as pulse mode except that a substantially constant radiation system 102 is used and the pattern on the array of individually controllable elements 104 is updated as the projection beam 110 scans across the substrate 114 and exposes it.

Combinations and/or variations on the above described modes of use or entirely different modes of use may also be employed.

Exemplary Control Arrangements for the Individually Controllable Elements

Figure 2:
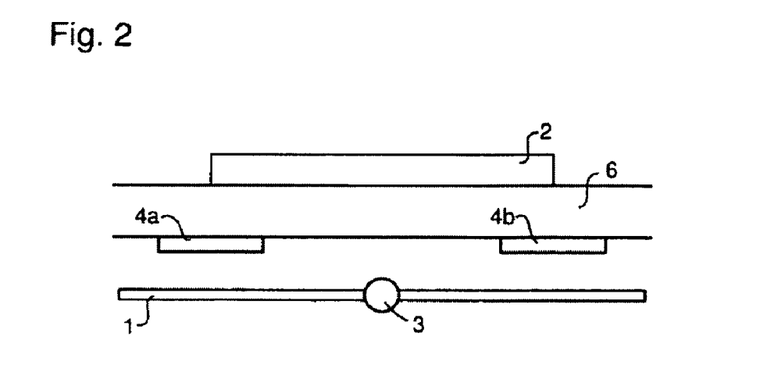
FIG. 2 depicts an individually controllable element according to an embodiment of the present invention.

FIG. 2 shows a schematic cross-sectional view of a single individually controllable element, according to an embodiment of the present invention. The individually controllable element comprises a mirror 1 pivotable about a hinge 3. The mechanical connection between the hinge 3 and an array substrate 6 supporting the mirror 1 is not shown in this view. Actuation of the mirror 1 is achieved by inducing a rotation about an axis of the hinge 3, which runs through the center of the hinge 3 into the page. The actuation can be induced by one or both of actuators 4a and 4b in response to a control signal received at a control signal receiving unit 2 attached to the array substrate 6. Actuators 4a and 4b can apply repulsive or attractive forces (e.g., electrostatic, magnetic, electromagnetic, etc.) to the mirror 1, which allow them to apply a torque about the axis of hinge 3. The torque applied by actuators 4a and 4b acts against a restoring force tending to return the mirror 1 into a neutral state in which it is oriented substantially parallel to the array substrate 6. In general, the mirror 1 may be actuated into a plurality of different states, corresponding to different angles from the neutral orientation, by different magnitudes of forces applied by the actuators 4a and 4b, as would become apparent to one of ordinary skill in the art upon reading this description.

In one embodiment, actuators 4a and 4b may operate separately to impose a torque on the mirror 1. For example, actuator 4a may apply an attractive force on its own to cause a clockwise torque or actuator 4b may do the same for an anticlockwise torque. One way this may be achieved is by electrostatically charging the actuators 4a and 4b. For example, if mirror 1 is electrically conducting, applying a charge to actuator 4a will cause a redistribution of charge within the mirror 1 such that the left hand side of mirror 1, labeled 1a in the diagram, will be attracted toward actuator 4a. A torque in the opposite sense may be achieved by applying a charge to actuator 4b in a similar fashion.

In another embodiment, the mirror 1 may be charged and each of the actuators 4a and 4b may be charged with an opposite polarity to the charge on mirror 1. This may be particularly effective if a plurality of mirrors (e.g., see FIGS. 3, 4, and 8) similar to the mirror 1 are arranged to be individually addressable.

Generally speaking, electrostatic actuation forces are always attractive in arrangements such as that discussed above. The magnitude of the force between two condenser plates (in this case, the electrodes 4a and 4b) can be shown to be dependent on $V^2$, where V is the potential difference between the plates. Magnetic actuation can be used to apply both attractive and repulsive forces.

Figure 3:
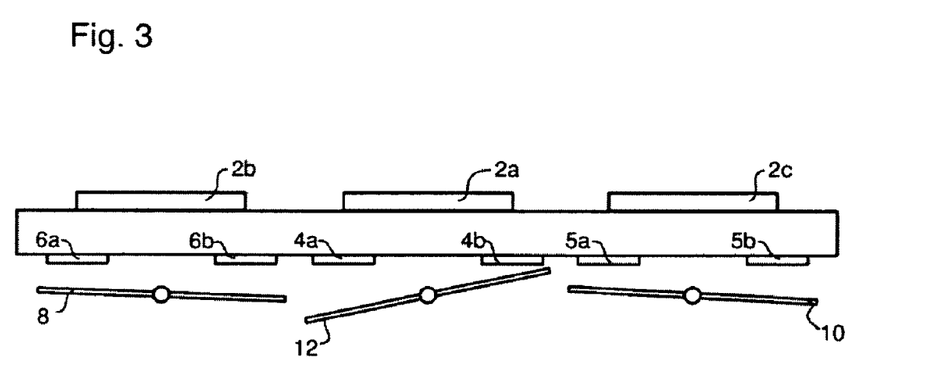
FIG. 3 depicts an actuated individually controllable element and two uncompensated disturbed individually controllable elements according to an embodiment of the present invention.

FIG. 3 shows actuation of hinged mirrors 8, 10, and 12, according to another embodiment of the present invention. A control signal is received at a control signal receiving unit 2a to displace mirror 12 from a neutral position, which is substantially parallel to the array substrate 6, to an actuated position at a certain angle away from parallel. In the embodiment shown, this is achieved by arranging for actuator 4a to apply a repulsive force to the mirror 8 and/or actuator 4b to apply an attractive force to the mirror 12. No control signal has been applied to the control signal receiving units 2b and 2c and mirrors 12 and 10 should be in their neutral position.

Because the mirrors in the array of individually controllable elements are very closely spaced, the influence of actuators 4a and 4b is most likely felt by the neighboring mirrors 8 and 10. As can be seen in FIG. 3, the repulsive force applied by actuator 4a causes a slight clockwise torque to mirror 8 and, similarly, the attractive force asserted by actuator 4b causes a slight clockwise torque to mirror 10. The magnitude of the cross-talk between mirror 12 and mirrors 8 and 10 will depend on the size of the torque applied to mirror 12, and/or factors such as the physical characteristics of the mirrors, hinges, etc. Therefore, according to an embodiment of the present invention, image degradation arising due to cross-talk effects, such as that described in this simplified example, can be avoided by applying a compensating control signal to the control signal receiving units 2b and 2c. In the case shown in FIG. 3, this would result in a small attractive force being applied by actuators 6b and 5b and/or a small repulsive force being applied by actuators 6a and 5a.

Figure 4:
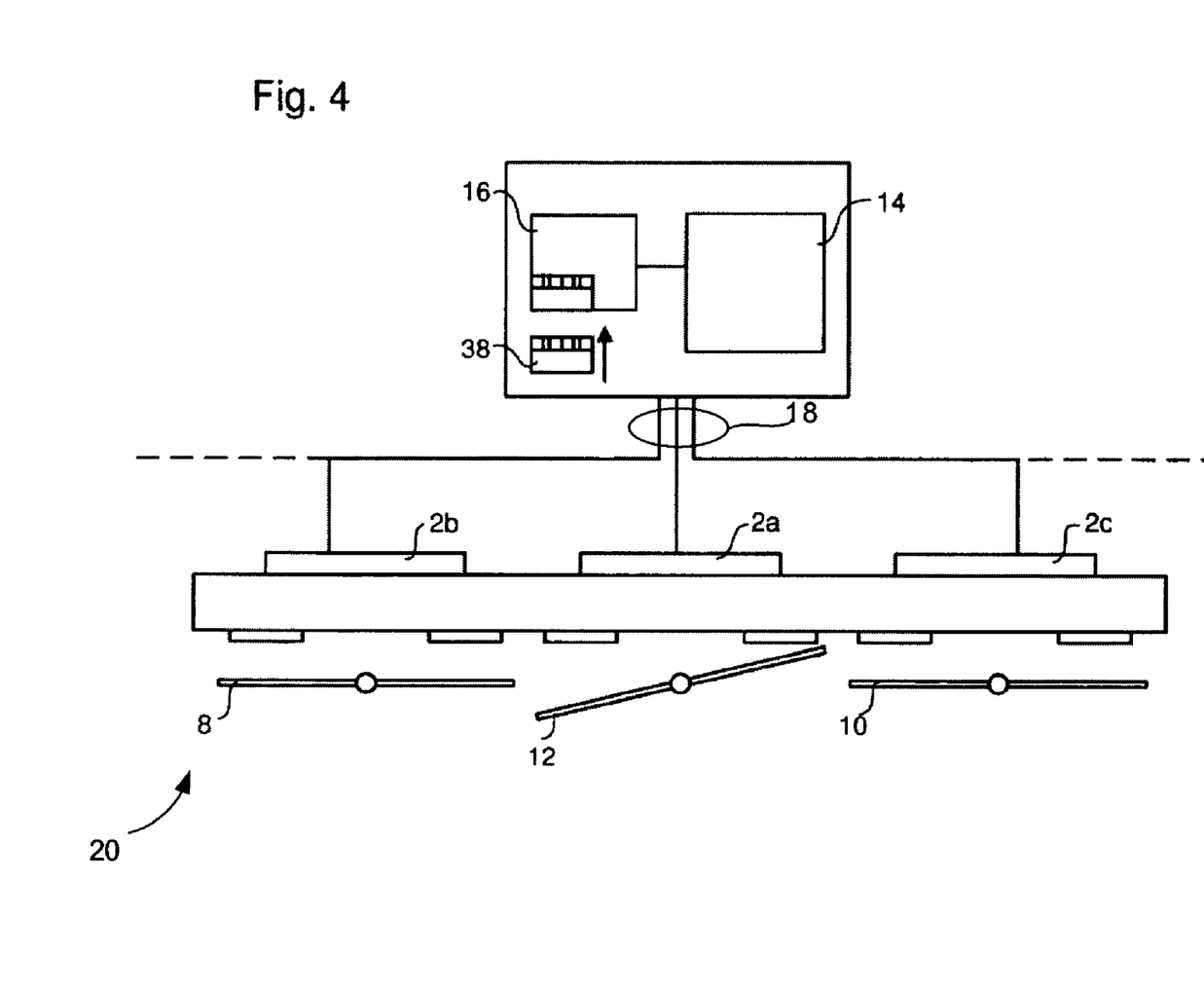
FIG. 4 depicts a control system and compensation device according to an embodiment of the present invention.

FIG. 4 shows a portion of a lithography system according to an embodiment of the present invention. In the portion shown, a control system 14 is coupled to a compensation device 16 that sends compensated control signals via control lines 18 to an array of individually controllable elements 8, 10, and 12. It is to be appreciated that, although only a representative portion 20 of the array of individually controllable elements is shown, any numbers of actuators and mirrors can be used. In this embodiment, an intended pattern for the three mirrors 8, 10, and 12 includes: mirror 12 being at an angle with respect to array substrate 6, and adjacent mirrors 8 and 10 being substantially parallel to array substrate 6. Instead of the control system 14 sending a control signal to the central mirror 12 only via the control signal receiving unit 2a, the control system 14 interacts with the compensation device 16 in order to send a compensated signal, consisting of separate control signals sent to each control signal receiving unit 2a, 2b and 2c.

In an embodiment, the compensation control signal applied to one given individually controllable element may not only depend on the actuation state of a single neighbor individually controllable element, but may be dependent on the actuation states of a large number of other individually controllable elements. The other individually controllable elements can be relevant either because they are in close proximity, so that actuating forces that decrease in strength with increasing separation are still relevant, or because there are other links, such as mechanical links, between the individually controllable elements in question. Moreover, the correction to be applied will depend not only on actuation state of surrounding individually controllable elements, but also on the actuation state of the individually controllable element in question since the size of the cross-talk interaction is often determined by geometric factors, such as the separation between portions of the individually controllable element to be corrected and nearby actuators.

Exemplary Arrangements of Individually Controllable Elements

Figure 5:
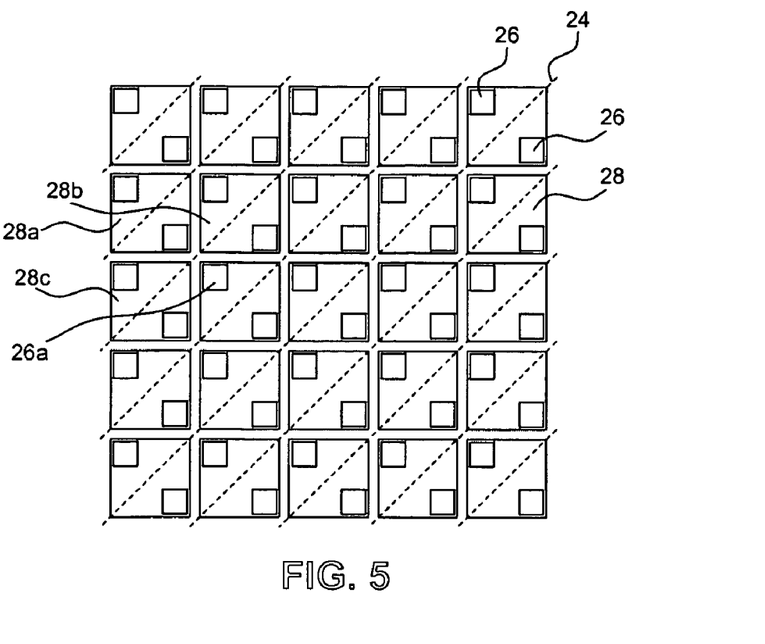
FIG. 5 depicts a top view of a portion of an array of individually controllable elements showing actuator positions and hinge axes.

FIG. 5 shows a top view of an arrangement of individually controllable elements, according to an embodiment of the present invention. In this embodiment, the individually controllable elements can be in a 5×5 grid. Each element 28 consists of a mirror individually pivotable about a hinge 24, such that an angle of pivot is controlled by actuators 26. An axis of rotation of the hinges 24 is oriented diagonally with respect to the edges of the mirrors 8, 10, and 12. It is to be appreciated that any orientation of the axis of rotation of the hinges 24 in relation to the mirrors 8, 10, and 12, including parallel to a mirror edge (e.g., either hinged about such an edge or about a center-line of the mirror). Where cross-talk arises because of the influence of actuators 26 on nearby individual controllable elements, such as between actuator 26a and mirrors 28a, 28b and 28c, to a first approximation the most important individually controllable elements to consider will simply be the nearest neighbors.

Figure 6A:
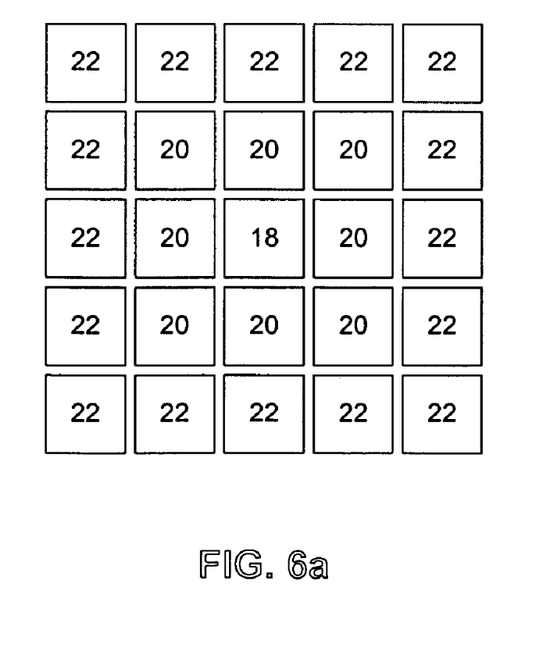
FIGS. 6a and 6b depict top views of a portion of an array of individually controllable elements indicating arrangements of elements at different separations from a first individually controllable, according to an embodiment of the present invention.
Figure 6B:
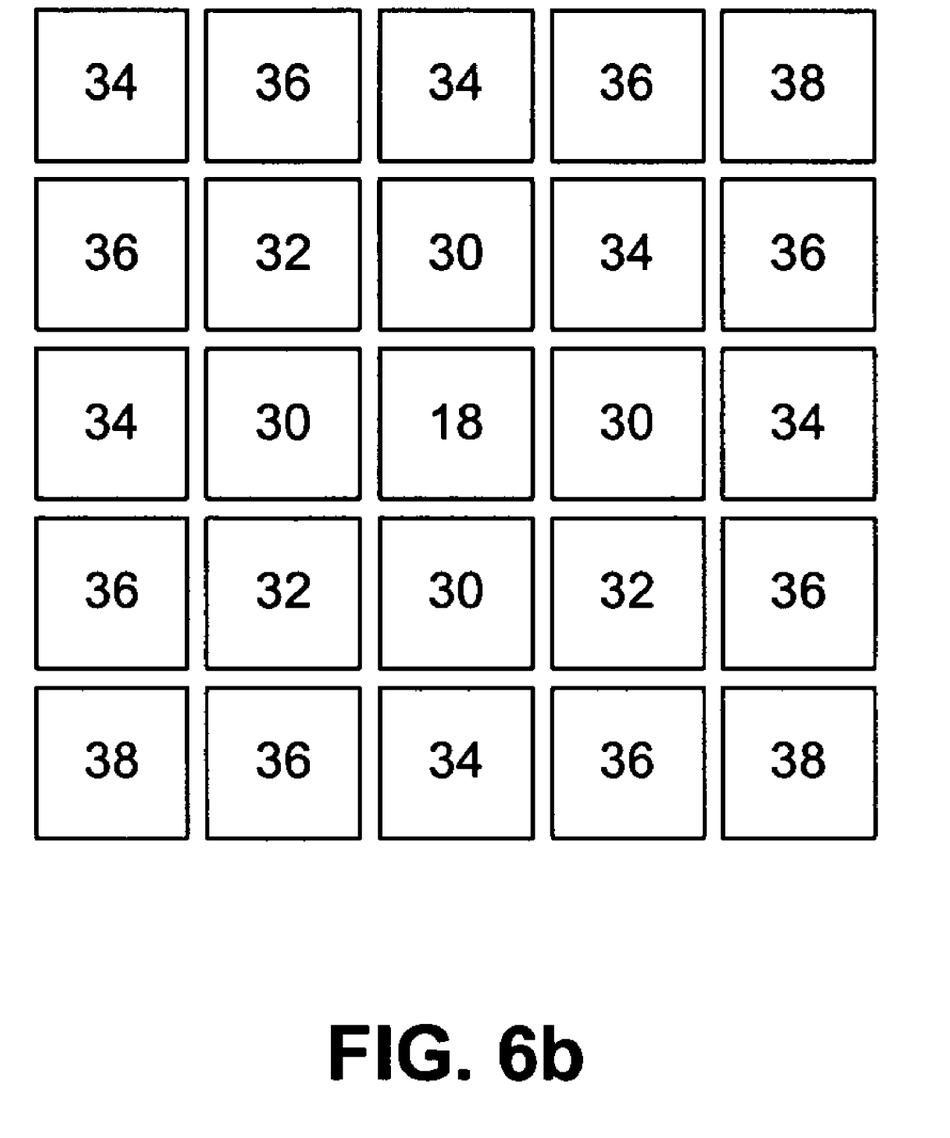

FIGS. 6a and 6b show top views of arrangements of individually controllable elements according to embodiments of the present invention.

In FIG. 6a, the individually controllable element at position 18 is influenced by cross-talk from the surrounding individually controllable elements 20 and 22. A first level of approximation may be achieved by considering only those individually controllable elements 20 that immediately surround individually controllable element 18, while not taking into account individually controllable elements 22. A second level of approximation, discussed below, can also take into account individually controllable elements 22.

FIG. 6b shows an embodiment in which a second and more refined approximation scheme is used, according the present invention. In this embodiment, the scheme may also consider the contribution to the cross-talk felt at individually controllable element 18 due to the individually controllable elements located further away than individually controllable elements 20 in FIG. 6a. For example, individually controllable elements 30, 32, 34, 36, and 38 are located at increasingly large distances from the central individually controllable element 18. According to this arrangement, the individual controllable elements 30, 32, 34, 36, and 38 are grouped into five different groups according to the likely magnitude of their influence on individually controllable element 18. In practice, the extent to which each group is important for the purposes of cross-talk compensation will depend on the exact geometry of the actuators and mirrors and will require detailed experimentation or calculation. Compensation can be applied accordingly.

Figure 7:
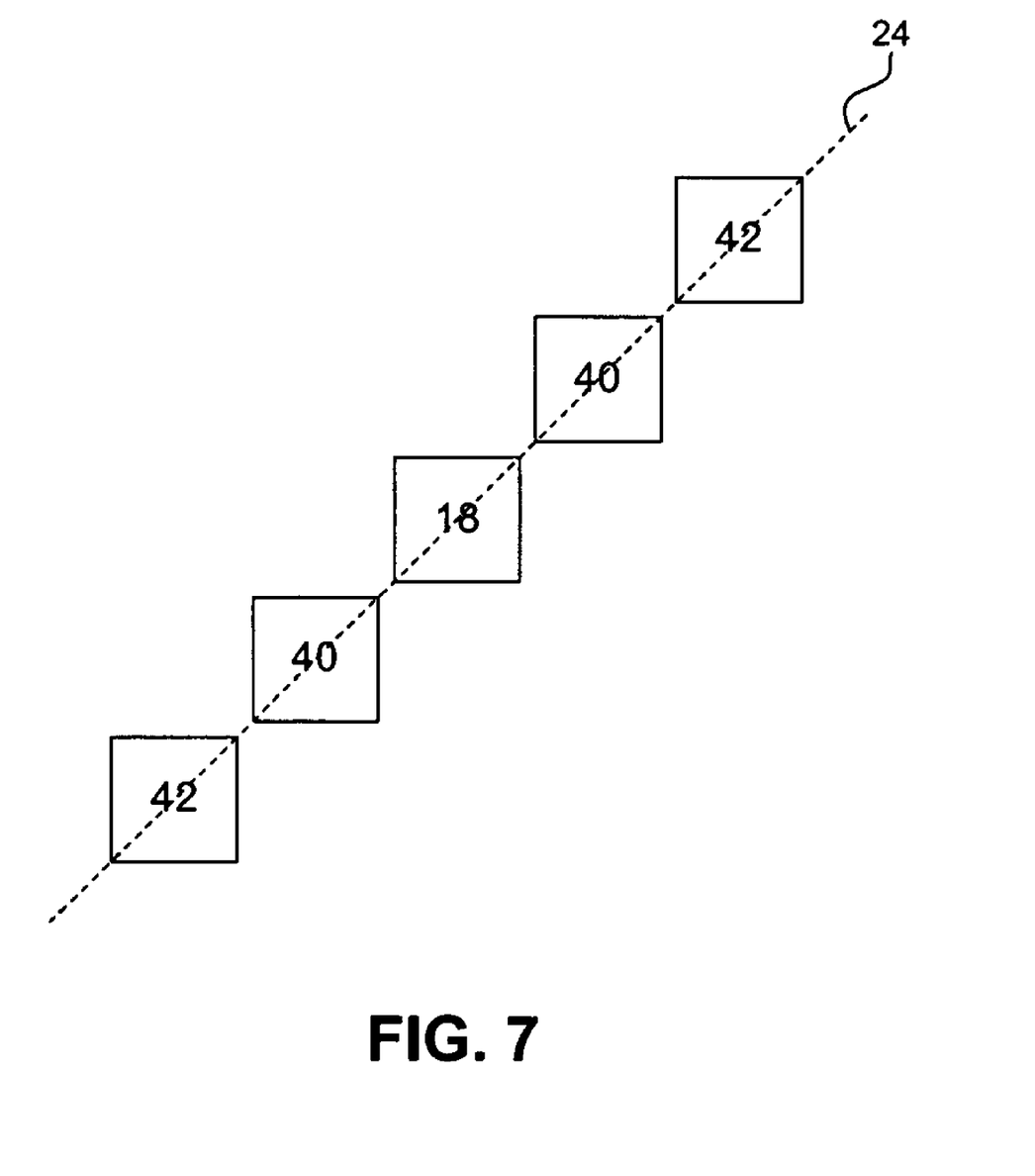
FIG. 7 depicts a top view of a portion of an array of individually controllable elements indicating mechanical cross-talk coupling according to an embodiment of the present invention.

FIG. 7 a top view of an arrangement of individually controllable elements, according to an embodiment of the present invention. One case in which cross-talk may arise due to mechanical interaction between individually controllable elements is where individual individually controllable elements share a hinge. In this case, the most important individually controllable elements to consider may not be those that immediately surrounding the individually controllable element to be compensated. Instead, it is likely to be the individually controllable elements that are located along the same hinge axis. In the embodiment shown in FIG. 7, individually controllable individually controllable elements 18, 40, and 42 share a hinge 24. Thus, the most important individually controllable elements to consider when compensating individually controllable element 18 may be individually controllable elements 40, followed by individually controllable elements 42. Compensation can be applied accordingly.

Exemplary Compensation Operations

In order to apply compensation, it is usually necessary for the compensation device 16 to be able to predict in advance how cross-talk will operate between individually controllable elements of the array of individually controllable individually controllable elements. One way in which this may be achieved is by carrying out calibration measurements. For example, starting with an array of nominally flat individually controlled elements, a first individually controllable element may be actuated to a known state by a known control signal. The disturbance which this actuation causes on the surrounding individually controllable elements is then recorded. The experiment may be repeated for a number of different actuation states of the first individually controllable individually controllable element. In this way, it is possible to build up a histogram, or the like, of how each individually controllable element will affect those around. When adjusting the control signal to be applied to the array of individually controllable individually controllable elements, the compensation may apply a convolution type operation to the intended control signal to be applied to the array of individually controllable individually controllable elements. The control signal to be applied may consist of a matrix of control signal values. A single control signal value can be assigned to each address corresponding to an individually controllable element of the array of individually controllable elements. The compensation device may act to apply a compensation function at each individually controllable element address in order to compensate the effect that the individually controllable element located at that particular address will have on its neighbors, as determined by the calibration measurements such as those discussed above.

As an alternative to carrying out extensive calibration measurements, it may be possible to explicitly calculate the expected cross-talk effects that are likely to occur. Physical interactions such as electrostatic repulsion and attraction are well understood and may be calculated accurately if the parameters such as the conductivity and geometries of the actuators and mirrors are well defined. The accuracy of any calculation methodology can be tested against calibration methods such as that discussed above. The data representing the cross-talk characteristics of a given array of individually controllable individually controllable elements may be stored in a memory module 38 (see FIG. 4), which may be linkable with the compensation device 16, whether the data arises from calibration measurements, from explicit calculations, or from a combination of the two methods.

Figure 8:
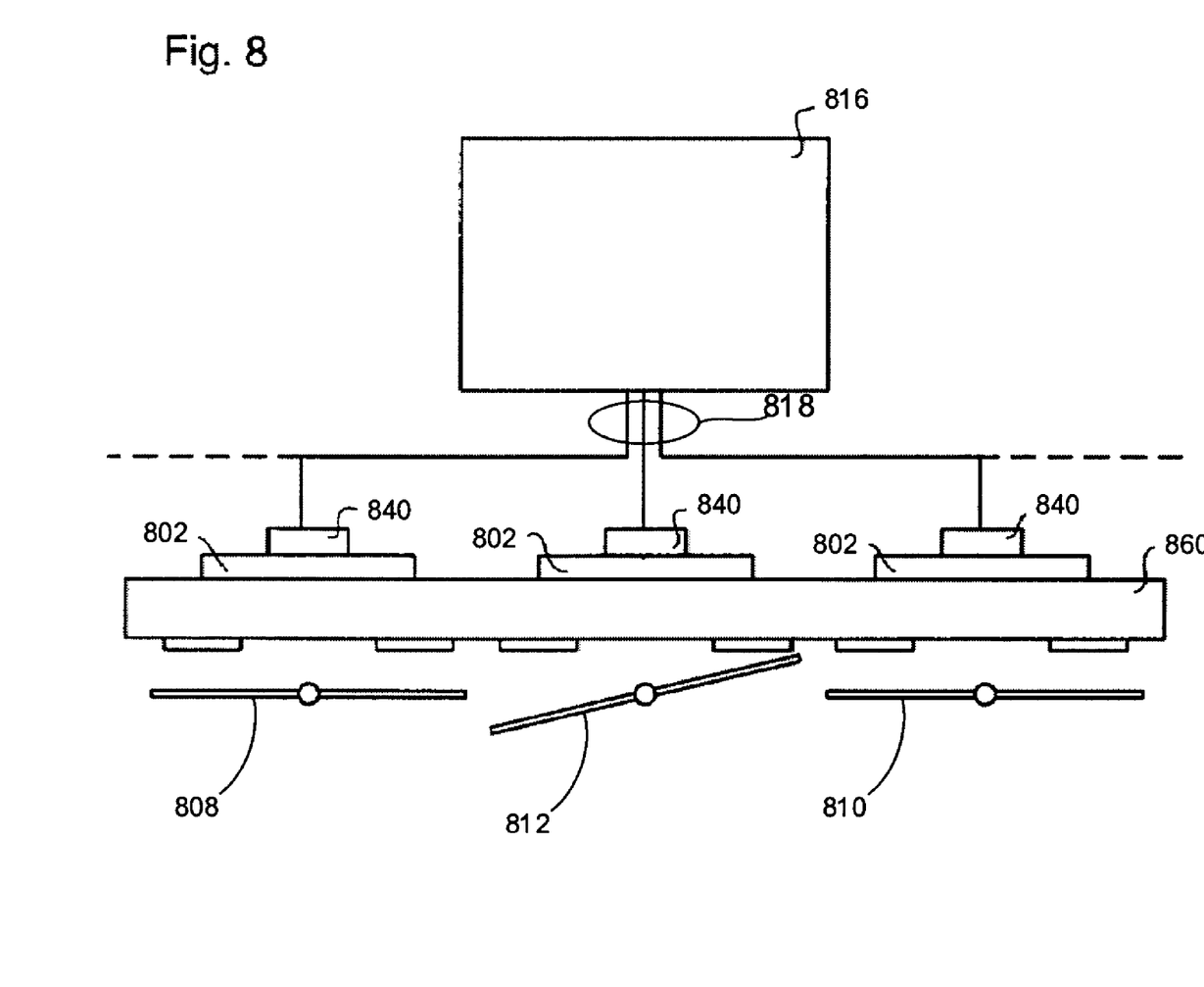
FIG. 8 depicts a control system and a compensation device comprising compensating members according to an embodiment of the present invention.

Another Exemplary Control Arrangement for the Individually Controllable Elements FIG. 8 shows an arrangement according to an embodiment of the present invention. The embodiment in FIG. 8 is similar to that depicted in FIG. 4. In the embodiment of FIG. 8, the control signal is compensated after it has been transmitted from control system 816. According to this arrangement, the control system 816 may be designed and arranged to operate as though the array of individually controllable elements 808, 810, and 812 did not suffer from cross-talk. This is achieved by providing compensating members 840 as part of a compensation device. Each individually controllable element 808, 810, and 812 of the array of individually controllable elements has associated with it one compensation member 840. Each compensation member 840 is designed to apply a correction to the control signal that it receives from the control system 816. The magnitude and sense of the correction to apply for each individually controllable element 808, 810, and/or 812 will be dependent on the actuation state of surrounding individually controllable elements 808, 810, and 812, respectively. Each compensation member 840 can be arranged to transmit information about its own actuation state to a selected group of individually controllable elements.

As for the embodiments discussed above, the size of the selected group will depend on how many other individually controllable elements are affected significantly by actuation of the individually controllable element in question. Calibration measurements and/or calculations, for example those described in the context of the embodiments shown above, may be used to determine the correction applied by each compensation member 840. It is to be appreciated that other calibration measurements and/or calculations can also be done, as would become apparent to one of ordinary skill in the art upon reading and understanding this description.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a beam of radiation;
   an array of individually controllable elements that impart the beam with a pattern;
   a projection system that projects the patterned beam onto a target portion of a substrate;
   a control system that sends a control signal to set each of the individually controllable element in a given state; and
   a compensation device that adjusts the control signal applied to a first individually controllable element in the array of individually controllable elements to compensate for effects on the first individually controllable element caused by the control signal applied to at least one other individually controllable element.

2. The lithographic apparatus according to claim 1, wherein the compensation device adjusts the control signal applied to the first individually controllable element based on the control signal applied to a group of individually controllable elements that are nearest neighbors of the first individually controllable element.

3. The lithographic apparatus according to claim 1, wherein the compensation device adjusts the control signal applied to the first individually controllable element based on the control signal applied to a group of individually controllable elements that are next-nearest neighbors of the first individually controllable element.

4. The lithographic apparatus according to claim 1, wherein the compensation device is arranged to adjust the control signal applied to the first individually controllable element based on the control signal applied to a group of individually controllable elements that are mechanically linked to the first individually controllable element.

5. The lithographic apparatus according to claim 1, wherein the compensation device comprises:
   a memory module that stores compensation data representing an expected effect on the first controllable element caused by a signal applied to at least one other individually controllable element.

6. The lithographic apparatus according to claim 5, wherein the compensation device is coupled to the control system to provide a control signal that is sent to the first individually controllable element that is adjusted by an amount based on the control signal applied to at least one other individually controllable element and the compensation data provided by the memory module.

7. The lithographic apparatus according to claim 5, wherein the compensation data takes into account one or more of the following forces: electrostatic, magnetostatic, and mechanical.

8. The lithographic apparatus according to claim 5, wherein at least a contribution to the compensation data is obtained from measurements of an effect the first individually controllable element caused by a control signal applied to at least one other individually controllable element.

9. The lithographic apparatus according to claim 5, wherein at least a contribution to the compensation data is obtained from a calculation of an expected effect on the first individually controllable element caused by a control signal applied to at least one other individually controllable element, the calculation being based on a geometry of the array of individually controllable elements.

10. The lithographic apparatus according to claim 1, wherein the compensation device comprises:
    a compensating member associated with the first individually controllable element, the compensating member being arranged to receive the control signal from the control system, adjust the level of the received signal as a predetermined function of the control signal to be applied to at least one other individually controllable element, and transmit the adjusted control signal to the first individually controllable element.

11. The lithographic apparatus according to claim 1, wherein the compensation device is located on a substrate supporting the array of individually controllable elements.

12. A manufacturing method, comprising:
    using an array of individually controllable elements to impart a projection beam with a pattern in its cross-section;
    projecting the patterned beam of radiation onto a target portion of a substrate;
    applying a control signal to each of a plurality of the individually controllable elements to set each of the plurality of individually controllable elements in a desired state; and
    adjusting the control signal applied to a first one of the plurality of individually controllable elements to compensate for effects on the first individually controllable element caused by the control signal to be applied to at least one other individually controllable element.

13. The method of claim 12, wherein the adjusting step adjusts the control signal applied to the first individually controllable element based on the control signal applied to a group of individually controllable elements that are a nearest neighbor or a next-nearest neighbor of the first individually controllable element.

14. The method of claim 12, wherein the adjusting step adjusts the control signal applied to the first individually controllable element based on the control signal applied to a group of individually controllable elements that are mechanically linked to the first individually controllable element.

15. The method of claim 12, wherein the adjusting step utilizes stored compensation data representing an expected effect on the first controllable element caused by the control signal applied to the at least one other individually controllable element.

16. The method of claim 15, wherein at least a contribution to the compensation data is obtained from measurements of an effect on the first individually controllable element caused by the control signal applied to the at least one other individually controllable element.

17. The method of claim 15, wherein at least a contribution to the compensation data is obtained from a calculation of an expected effect on the first individually controllable element caused by the control signal applied to the at least one other individually controllable element, the calculation being based on a geometry of the array of individually controllable elements.

18. The method of claim 12, wherein the adjusting step comprises:
    receiving the control signal for the first one of the plurality of individually controllable elements;
    adjusting a level of the received control signal as a predetermined function of the control signal to be applied to the at least one other individually controllable element; and
    transmitting the adjusted control signal to the first individually controllable element.

* * * * *